(12) United States Patent
Adachi

(10) Patent No.: US 6,428,840 B2
(45) Date of Patent: Aug. 6, 2002

(54) METHOD OF PRODUCING CATHODE RAY TUBE AND METHOD OF FORMING FILMS

(75) Inventor: Takumi Adachi, Saitama (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/794,000

(22) Filed: Feb. 28, 2001

(30) Foreign Application Priority Data

Mar. 13, 2000 (JP) ........................................ 2000-068018

(51) Int. Cl.$^7$ .......................... B05D 5/06; C23C 16/00; H01J 31/26
(52) U.S. Cl. ...................... 427/69; 427/64; 427/248.1; 427/250; 427/255.15; 427/255.7; 313/386
(58) Field of Search .............................. 427/248.1, 250, 427/255.1, 255.7, 64, 164, 165, 69, 294, 66, 68; 313/386

(56) References Cited

U.S. PATENT DOCUMENTS

| | | | | |
|---|---|---|---|---|
| 2,303,563 A | * | 12/1942 | Law ............................ | 250/164 |
| 3,952,226 A | * | 4/1976 | Turnbull ...................... | 313/481 |
| 4,285,990 A | * | 8/1981 | Hernqvist ..................... | 427/39 |
| 4,597,787 A | * | 7/1986 | Jacobson ...................... | 65/3.12 |

OTHER PUBLICATIONS

CRC Handbook of Chemistry and Physics, 50th Edition, 1969, pp. B–83 and B–84.*

* cited by examiner

Primary Examiner—Shrive P. Beck
Assistant Examiner—William P. Fletcher, III
(74) Attorney, Agent, or Firm—Rader, Fishman & Grauer PLLC; Ronald P. Kananen

(57) ABSTRACT

Disclosed is a method of forming a reflection film and a heat absorbing film on the inner surface of a panel of a cathode ray tube by using a vacuum vapor-deposition process. In the case of using aluminum as the material for the reflection film, chromium is used as the material for the heat absorbing film. Chromium has a boiling point under a vacuum pressure at the time of vapor-deposition, which is higher than that of aluminum. The mixture of aluminum and chromium is supplied to a heater portion, and is heated and vaporized by the heater portion to be deposited on the inner surface of the panel. In this deposition, aluminum is first vapor-deposited and then chromium is vapor-deposited. Accordingly, the two kinds of films are formed in one vapor-deposition step.

3 Claims, 3 Drawing Sheets

US 6,428,840 B2

METHOD OF PRODUCING CATHODE RAY TUBE AND METHOD OF FORMING FILMS

BACKGROUND OF THE INVENTION

The present invention relates to a method of producing a cathode ray tube, and particularly to a method of forming, on the inner surface of a panel, a metal back film, that is, a reflection film for improving the intensity of luminescence by a phosphor and a heat absorbing film for reducing the degree of mislanding of an electron beam due to thermal expansion of a mask used for color selection, and a method of forming films suitable for forming a reflection film and a heat absorbing film on the inner surface of a panel.

In the step of producing a panel of a color cathode ray tube, a phosphor film is formed on the inner surface of a panel and then a reflection film made from aluminum is formed on the phosphor film.

The phosphor film is formed by forming phosphors of red, green, and blue on a black matrix film already formed on the inner surface of the panel at specific positions corresponding to a specific pattern, and forming an intermediate film for smoothening the surfaces of the phosphors thereon.

The reflection film is formed by vapor-depositing aluminum on the inner surface of the panel on which the phosphor film has been formed.

In this way, as shown in FIG. 1, a phosphor film 2 and a reflection film 3 are formed on the inner surface of the panel 1.

In a color cathode ray tube, generally, three electron beams emitted from an electron gun are subjected to color selection by a so-called mask such as an aperture grill or a shadow mask.

The three electron beams, which have passed through the mask, collide with phosphors of the corresponding colors.

When irradiated with the electron beams, the mask generates heat, with a result that the temperature of the mask is increased.

The temperature of the mask is further increased due to the fact that the radiation heat of the mask is reflected from the reflection film formed on the phosphor film.

As a result, the thermal expansion of the mask becomes significant, resulting in a deviation in landing position of each electron beam when the electron beam reaches the phosphor.

The deviation in landing position of each electron beam is called "mislanding" of the electron beam.

Such a phenomenon causes an inconvenience such as color shift on an image displayed on a screen of the cathode ray tube.

To reduce the degree of mislanding of electron beams, there have been known methods of forming a heat absorbing film on a reflection film already formed on the inner surface of a panel.

The heat absorbing film functions to absorb the radiation heat generated by a mask.

The use of the heat absorbing film is thus effective to suppress the thermal expansion of the mask.

According to the related art methods, the reflection film is first formed by vapor-depositing aluminum on the inner surface of the panel, and then the heat absorbing film is formed thereon.

For example, according to one of the related art methods, a heat absorbing film is formed on the inner surface of a panel, on which a reflection film has been formed, by coating the inner surface of the panel with a suspension of graphite by spraying.

According to another related art method, aluminum is vapor-deposited to form a reflection film, and subsequently aluminum is again vapor-deposited at a vacuum pressure higher than a vacuum pressure set at the time of forming the reflection film, to form a heat absorbing film made from aluminum oxide on the reflection film.

According to a further related art method, a heat absorbing film is formed by vapor-depositing a blackened material other than aluminum, for example, manganese or tin.

Each of the above-described related art methods, however, requires independent two film formation steps for forming a reflection film and a heat absorbing film on the inner surface of a panel.

As an inconvenient result, the process of producing a panel of a cathode ray tube is complicated.

SUMMARY OF THE INVENTION

An object of the present invention is to provide a method of forming a reflection film and a heat absorbing film on the inner surface of a panel of a cathode ray tube without complicating a process of producing the cathode ray tube.

To achieve the above object, according to the present invention, there is provided a method of producing a cathode ray tube, which is adapted to form a reflection film and a heat absorbing film on the inner surface of a panel by using a vacuum vapor-deposition process, including the steps of: supplying a first material for forming the reflection film and a second material for forming the heat absorbing film to a heating source; and heating and vaporizing the first and second materials by the heating source, thereby depositing the first and second materials on the inner surface of the panel; wherein the second material has a boiling point under a vacuum pressure at the time of vapor-deposition, which is higher than that of the first material.

With this configuration, when the first and second materials supplied to the heating source are heated by the heat source, the first material lower in boiling pressure under a vacuum pressure at the time of vapor-deposition is first vaporized to be deposited on the inner surface of the panel, and then the second material is vaporized to be deposited on the inner surface of the panel.

As a result, the reflection film and the heat absorbing film are continuously formed in one vapor-deposition step.

This is effective to simplify the process of producing a cathode ray tube and hence to reduce the production cost thereof.

DETAILED DESCRIPTION OF A PREFERRED EMBODIMENT

Hereinafter, an embodiment of the present invention suitable for producing a cathode ray tube, particularly, a panel of a cathode ray tube will be described with reference to the drawings.

Figure 1:
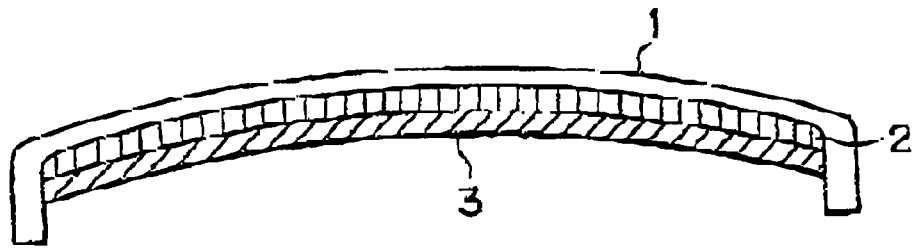
FIG. 1 is a sectional view of a panel of a cathode ray tube, showing a positional relationship between a phosphor film and a reflection film provided on the inner surface of the panel.
Figure 2:
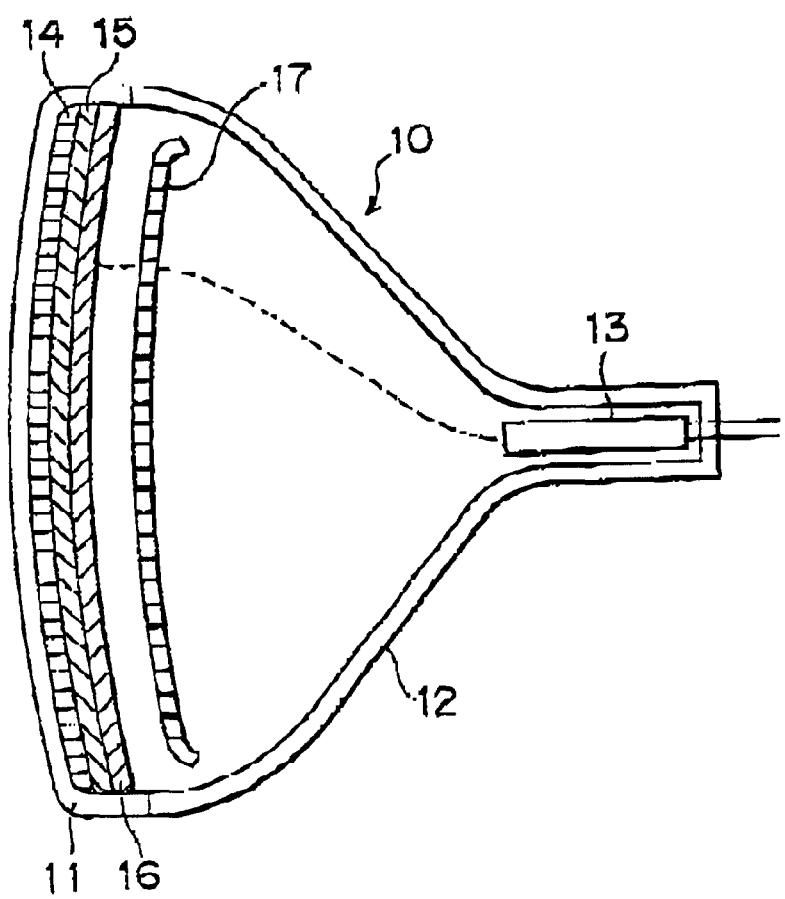
FIG. 2 is a sectional view of a structure of a cathode ray tube to which the present invention is applied, showing a phosphor film provided on the inner surface of a panel, a reflection film provided on the phosphor film, a heat absorbing film provided on the reflection film, and a mask provided adjacently to the heat absorbing film.

FIG. 2 is a sectional side view of a cathode ray tube produced in accordance with a production method of the present invention.

Referring to FIG. 2, a cathode ray tube main body 10 includes a glass made panel 11 and a funnel 12.

The end surface of an opening of the panel 11 is butted to the end surface of an opening of the funnel 12 and is integrally joined thereto with a sealant such as frit.

An electron gun 13, which functions as an electron beam emission source, is contained in a neck portion of the funnel 12.

A phosphor film 14, a reflection film 15, and a heat absorbing film 16 are formed on the inner surface of the panel 11.

A mask 17 for color selection, such as an aperture grill or a shadow mask, is built in the cathode ray tube main body 10.

The mask 17 has a large number of slits or apertures for color selection.

The mask 17 is disposed in the cathode ray tube main body 10 at a position near the inner surface of the panel 11.

An electron beam emitted from the electron gun 13 passes through one of the slits or apertures of the mask 17 as shown by a broken line in the figure, to reach the inner surface of the panel 11.

The electron beam, which has reached the inner surface of the panel 11, makes the corresponding phosphor of the phosphor film 14 formed on the inner surface of the panel 11 luminous.

Figure 3:
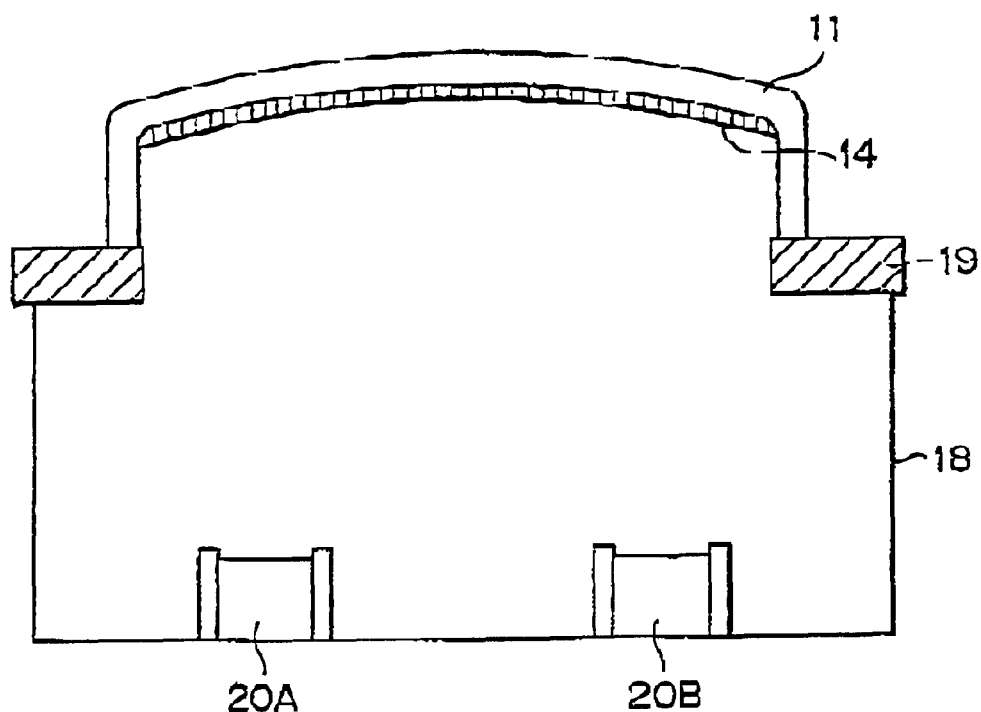
FIG. 3 is a view of a vacuum vapor-deposition system used for the present invention, showing an arrangement of a panel, a vacuum chamber, and a heater for vapor-deposition.

FIG. 3 is a schematic view of a vacuum vapor-deposition system used for the present invention.

Referring to FIG. 3, a panel receiving base 19 is provided on an upper portion of a vacuum chamber 18.

The panel 11 is placed on the panel receiving base 19 with the phosphor film 14 formed on the inner surface of the panel 11 directed downwardly.

Two heater portions 20A and 20B as heating sources are provided inside the vacuum chamber 18.

The two heater portions 20A and 20B are disposed in such a manner as to be opposed to the phosphor film 14 formed on the inner surface of the panel 11 placed on the panel receiving base 19.

The heater portions 20A and 20B may be heated by a resistance heating method, an electron beam heating method, or a high frequency induction heating method.

The number of the heater portions and the arrangement thereof may be suitably set depending on the size and shape of the panel 11 on which films are to be formed.

A method of forming a reflection film and a heat absorbing film on the inner surface of the panel 11, that is, on the phosphor film 14 by using the above-described vacuum vapor-deposition system.

First, the panel 11 is placed on the panel receiving base 19 and materials are supplied to the heater portions 20A and 20B disposed in the vacuum chamber 18.

At this time, the materials are put in crucibles provided on the heater portions 20A and 20B.

Here, in the case of using aluminum as the material for forming the reflection film 15, that is, as a first material, a material having a boiling point under a vacuum pressure at the time of vapor-deposition which is higher than that of aluminum and exhibiting a desired heat absorbing function is used as the material for forming the heat absorbing film 16, that is, as a second material.

To be more specific, assuming that the vacuum pressure at the time of vapor-deposition is $1\times10^{-4}$ Torr ($1.33\times10^{-2}$ Pa), the boiling point of aluminum under the vacuum pressure is about 980° C.

Accordingly, a material having a boiling point higher than that of aluminum, for example, chromium having a boiling point of 1170° C. under the vacuum pressure of $1\times10^{-4}$ Torr may be selected as the material for forming the heat absorbing film 16.

Powders of aluminum and chromium, which are selected as the two kinds of materials satisfying the above requirement, are mixed, for example, at a weight ratio of 1:1.

The resultant mixture may be compressed.

The mixture thus prepared is put in the crucibles on the heater portions 20A and 20B.

The inside of the vacuum chamber 18 is then evacuated by using a vacuum pump or the like.

The inner pressure of the vacuum chamber 18 is thus reduced to a specific vacuum pressure.

The heater portions 20A and 20B are then operated.

The mixture is thus heated in accordance with a specific temperature profile to be described later.

Figure 4:
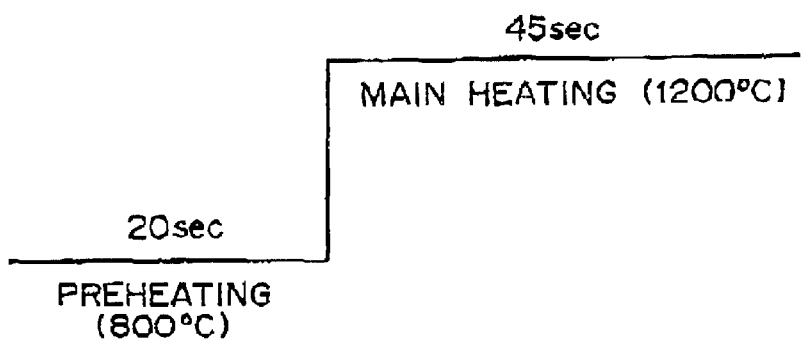
FIG. 4 is a graph showing one example of a heating temperature profile for vapor-deposition, which is used in a method according to an embodiment of the present invention.

FIG. 4 shows a profile of a heating temperature at the time of vapor-deposition.

It should be noted that the temperature profile shown in FIG. 4 indicates the heating temperature of the material heated by the corresponding one of the heater portions 20A and 20B with an elapsed time.

Accordingly, the temperature of each of the heater portions 20A and 20B is controlled to a temperature slightly higher than the above heating temperature of the material.

As is apparent from FIG. 4, the mixture is first subjected to preliminary heating for 20 sec.

The temperature in the preliminary heating step is set to a temperature lower than the above-described boiling point of aluminum, that is, 980° C., for example, set to 800° C. as shown in FIG. 4.

Next, the heating temperature is raised to a temperature higher than 800° C., and the mixture is subjected to main heating at such a temperature for 45 sec.

The temperature in the main heating step is set to a temperature higher than the above-described boiling point of chromium, that is, 1170° C., for example, set to 1200° C. as shown in FIG. 4.

The mixture is thus heated by each of the heater portions 20A and 20B in accordance with the above-described temperature profile.

Accordingly, aluminum lower in boiling point, that is, the first material is first vaporized to be deposited on the inner surface of the panel 11.

Subsequently, chromium higher in boiling point, that is, the second material is vaporized to be deposited on the inner surface of the panel 11.

As a result, the reflection film 15 made from aluminum and the heat absorbing film 16 made from chromium are continuously stacked on the inner surface of the panel 11, that is, on the phosphor film 14.

By using such a production method, the reflection film 15 and the heat absorbing film 16 can be simultaneously formed on the inner surface of the panel 11 in one vapor-deposition step.

The process of producing a cathode ray tube can be thus simplified.

A time required for carrying out the film formation step for forming the reflection film 15 and the heat absorbing film 16 can be significantly reduced.

Since the mixture of powders of aluminum and chromium is supplied to each of the heater portions 20A and 20B, chromium can be efficiently heated with the aid of the thermal conduction of aluminum previously melted.

This is effective to relatively easily evaporate chromium having the high boiling point.

According to the present invention, however, it is not necessarily required to supply the two materials in the form of the mixture.

For example, a powder of aluminum and a powder of chromium are weighed so that a weight ratio between the amounts of aluminum and chromium becomes a specific weight ratio.

The powders of aluminum and chromium are supplied to the heater portions 20A and 20B, respectively.

Alternatively, pellets of aluminum and pellets of chromium may be supplied to the heater portions 20A and 20B, respectively.

Figure 5:
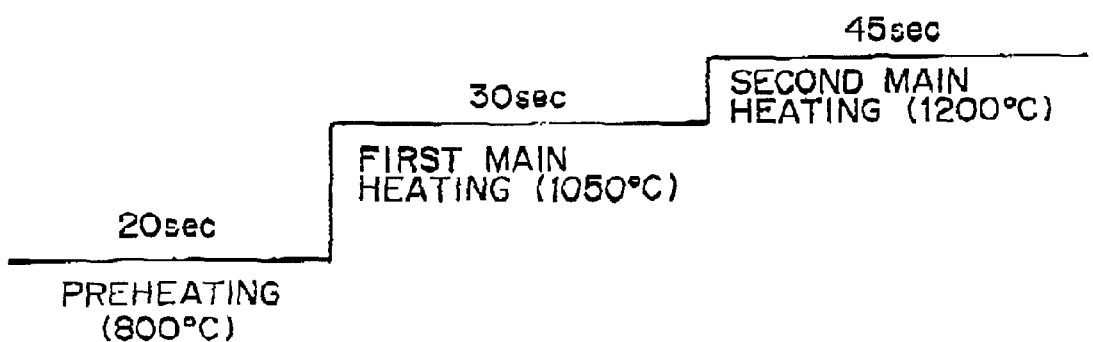
FIG. 5 is a graph showing another example of the heating temperature profile for vapor-deposition, which is used in the method according to the embodiment of the present invention.

FIG. 5 shows another example of the heating temperature profile at the time of vapor-deposition.

First, like the above-described temperature profile shown in FIG. 4, the mixture is first subjected to preliminary heating at 800° C. for 20 sec.

Next, the heating temperature is set to a temperature higher than the boiling point of aluminum, that is, 980° C. and lower than the boiling point of chromium, that is, 1170° C., for example, set to 1050° C. as shown in FIG. 5.

The mixture is subjected to first main heating at 1050° C. for 30 sec.

Next, the heating temperature is set to a temperature higher than the boiling point of chromium, that is, 1170° C., for example, set to 1200° C. as shown in FIG. 5.

The mixture is subjected to second main heating at 1200° C. for 45 sec.

The two materials are thus heated by each of the heater portions 20A and 20B in accordance with the temperature profile shown in FIG. 5.

The two materials may be supplied in the form of the mixture.

In such a temperature profile, the heating temperature at the time of vapor-deposition is controlled to be switched on the basis of the boiling point of each of the first and second materials.

Accordingly, first, aluminum lower in boiling point is evaporated by the first main heating to be deposited on the inner surface of the panel 11.

Subsequently, chromium higher in boiling point is evaporated by the second main heating to be deposited on the inner surface of the panel 11.

As a result, the evaporation of aluminum and the evaporation of chromium to the inner surface of the panel 11 can be separately performed in accordance with one temperature profile.

In other words, it is possible to prevent aluminum and chromium from being simultaneously evaporated.

Accordingly, each of the reflection film 15 and the heat absorbing film 16 can be formed as a high purity film.

In the above-described embodiment, aluminum is used as the first material and chromium is used as the second material; however, the present invention is not limited thereto but may be applicable to a combination of other materials (which may be other than metals).

Further, in the above-described embodiment, the present invention is applied to the process of producing a cathode ray tube; however, the present invention is not limited thereto but may be widely applicable to a method of forming two or more kinds of films on a specific surface by using the vacuum vapor-deposition process.

In this case, two or more kinds of materials different in boiling point under a vacuum pressure at the time of vapor-deposition are supplied to a heating source, and the two or more kinds of materials are heated and evaporated by the heating source to be deposited on the specific surface.

While the preferred embodiment of the present invention has been described using the specific terms, such description is for illustrative purposes only, and it is to be understood that changes and variations may be made without departing from the spirit or scope of the following claims.

What is claimed is:

1. A method of producing a cathode ray tube, which is adapted to form a reflection film and a heat absorbing film on the inner surface of a panel by using a vacuum vapor-deposition process, comprising the steps of:

supplying aluminum as a first material for forming the reflection film and chromium as a second material for forming the heat absorbing film to a heating source; and heating and vaporizing the first and second materials by the heating source, thereby depositing the reflection film and heat absorbing film on the inner surface of the panel.

2. A method of producing a cathode ray tube according to claim 1, wherein the heating temperature at the time of vapor-deposition is controlled to be switched on the basis of the boiling point of each of the first and second materials.

3. A method of producing a cathode ray tube according to claim 1, wherein the first and second materials are mixed with each other, and the resultant mixture is supplied to the heating source.

* * * * *